(12) United States Patent
Chen et al.

(10) Patent No.: US 8,921,884 B2
(45) Date of Patent: Dec. 30, 2014

(54) BATWING LED WITH REMOTE PHOSPHOR CONFIGURATION

(71) Applicant: TSMC Solid State Lighting Ltd., Hsinchu (TW)

(72) Inventors: Ching-Yi Chen, Hsinchu (TW); Yu-Sheng Tang, Qishan Township (TW); Hao-Yu Yang, Taoyuan (TW); Hsin-Hung Chen, Hsinchu (TW); Tzu-Wen Shih, Xinbei (TW)

(73) Assignee: TSMC Solid State Lighting Ltd., Hsin-Chu (TW)

( * ) Notice: Subject to any disclaimer, the term of this patent is extended or adjusted under 35 U.S.C. 154(b) by 0 days.

(21) Appl. No.: 14/284,491

(22) Filed: May 22, 2014

(65) Prior Publication Data

US 2014/0247578 A1    Sep. 4, 2014

Related U.S. Application Data

(60) Continuation of application No. 13/946,007, filed on Jul. 19, 2013, now Pat. No. 8,735,190, which is a division of application No. 13/114,730, filed on May 24, 2011, now Pat. No. 8,497,519.

(51) Int. Cl.
| | | |
|---|---|---|
| *H01L 33/00* | (2010.01) | |
| *F21K 99/00* | (2010.01) | |
| *F21V 13/02* | (2006.01) | |
| *F21V 13/14* | (2006.01) | |
| *H01L 33/58* | (2010.01) | |
| *H01L 33/54* | (2010.01) | |
| *H01L 33/50* | (2010.01) | |

(52) U.S. Cl.
CPC . *F21K 9/56* (2013.01); *F21V 13/02* (2013.01); *F21V 13/14* (2013.01); *H01L 33/50* (2013.01); *H01L 33/58* (2013.01); *H01L 33/54* (2013.01); *H01L 33/505* (2013.01)
USPC .............................................. 257/98; 257/88

(58) Field of Classification Search
CPC ......... H01L 33/50; H01L 33/54; H01L 33/58; H01L 33/505
USPC ..................................................... 257/98, 88
See application file for complete search history.

(56) References Cited

U.S. PATENT DOCUMENTS

| | | | |
|---|---|---|---|
| 6,896,381 | B2 | 5/2005 | Benitez et al. |
| 7,385,653 | B2 | 6/2008 | Kim et al. |
| 2006/0083000 | A1 | 4/2006 | Yoon et al. |
| 2006/0138437 | A1 | 6/2006 | Huang et al. |
| 2007/0109952 | A1 | 5/2007 | Jeong et al. |
| 2008/0157114 | A1 | 7/2008 | Basin et al. |
| 2009/0015157 | A1 | 1/2009 | Sun et al. |
| 2010/0133560 | A1 | 6/2010 | Kim et al. |

*Primary Examiner* — Douglas Menz
(74) *Attorney, Agent, or Firm* — Haynes and Boone, LLP

(57) ABSTRACT

A lighting apparatus includes a substrate. One or more light-emitting devices are disposed over the substrate. A lens is molded over the substrate and over the one or more light-emitting devices. A recess is disposed in the lens. The recess circumferentially surrounds the one or more light-emitting devices in a top view. The recess is at least partially filled with phosphor particles.

20 Claims, 15 Drawing Sheets

BATWING LED WITH REMOTE PHOSPHOR CONFIGURATION

PRIORITY DATA

This application is a continuation application of U.S. patent application Ser. No. 13/946,007, filed on Jul. 19, 2013, now U.S. Pat. No. 8,735,190, which is a divisional application of U.S. patent application Ser. No. 13/114,730, filed on May 24, 2011, both entitled "Batwing LED with Remote Phosphor Configuration," now U.S. Pat. No. 8,497,519, the disclosures of each of which are hereby incorporated by reference in their respective entireties.

FIELD OF THE INVENTION

The present disclosure relates generally to a semiconductor device and, more particularly, to semiconductor lighting emitting diode (LED).

BACKGROUND

A Light-Emitting Diode (LED), as used herein, is a semiconductor light source for generating a light at a specified wavelength or a range of wavelengths. LEDs are traditionally used for indicator lamps, and are increasingly used for displays. An LED emits light when a voltage is applied across a p-n junction formed by oppositely doping semiconductor compound layers. Different wavelengths of light can be generated using different materials by varying the bandgaps of the semiconductor layers and by fabricating an active layer within the p-n junction.

Traditionally, LEDs are made by growing light-emitting structures on a growth substrate. The light-emitting structures along with the underlying growth substrate are separated into individual LED dies. At some point before or after the separation, electrodes or conductive pads are added to the each of the LED dies to allow the conduction of electricity through the structure. LED dies are then packaged by adding a package substrate, optional phosphor material, and optics such as lens and reflectors to become an optical emitter.

Optical emitter specifications typically identify application-specific radiation patterns outputted by the optical emitter. A commonly used beam pattern is the batwing beam pattern for illuminating a flat surface, in traffic signal applications, or in a backlighting unit for a display. The batwing beam pattern may be defined by having two roughly equal peaks in a candela distribution plot with a valley between the peaks at about 0 degrees.

Optical emitters are designed to meet these specifications. While existing designs of optical emitters have been able to meet batwing beam pattern requirements, they have not been entirely satisfactory in every aspect. Reliable and more efficient designs that are easier to manufacture continue to be sought.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

SUMMARY

Figure 1:
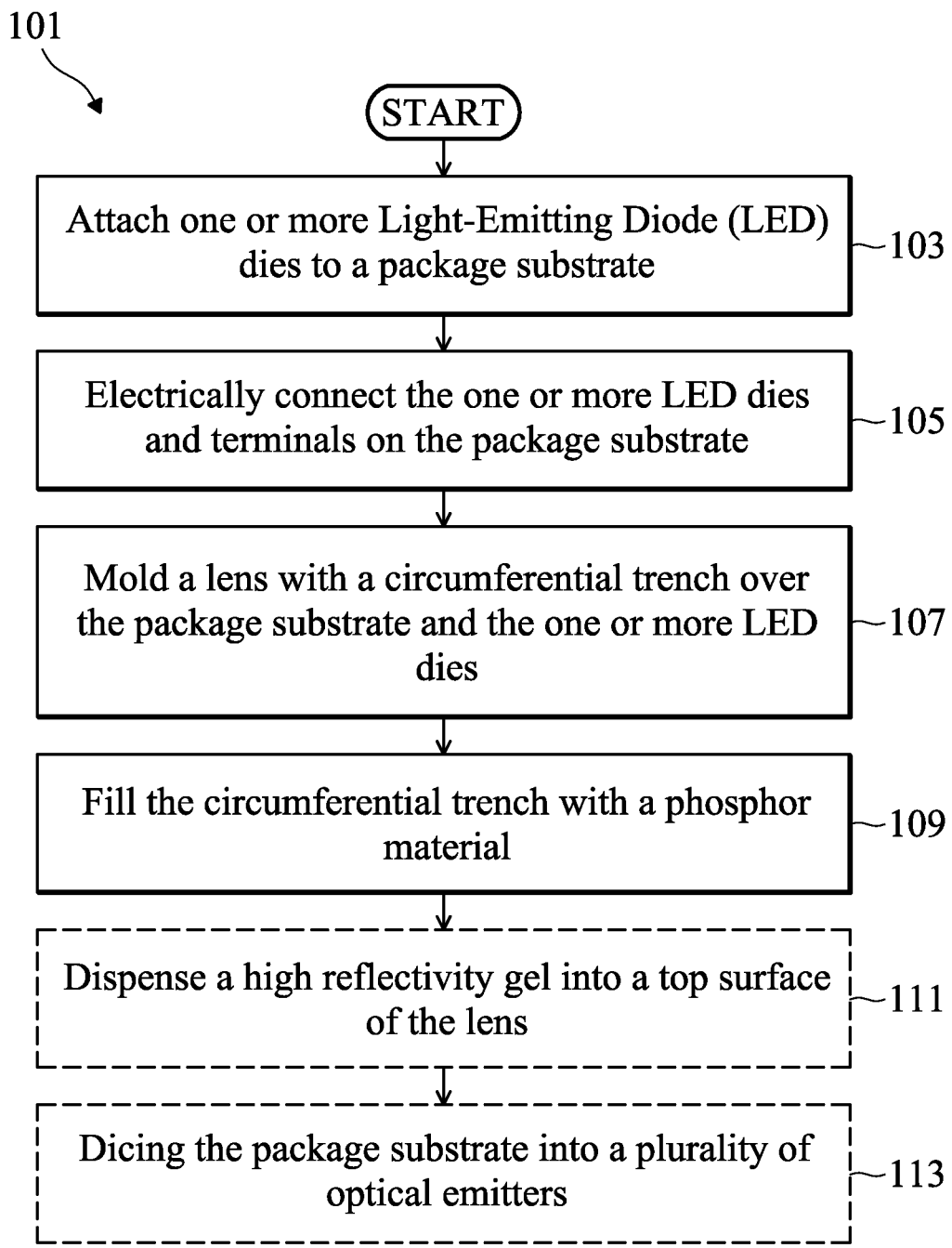
FIG. 1 is a flowchart illustrating a method of fabricating an optical emitter according to various aspects of the present disclosure.

One aspect of the present disclosure involves an optical emitter including one or more Light-Emitting Diode (LED) dies, a package substrate attached to one side of the one or more LED dies, electrical connections between the one or more LED dies and terminals on the package substrate, a molded lens bonded to the package substrate directly contacting the one or more LED dies and phosphor material embedded in the molded lens in a circumferential cylinder. The optical emitter outputs a batwing beam pattern through the molded lens.

Another aspect of the present disclosure involves a method of fabricating an optical emitter. The method includes attaching one or more Light-Emitting Diode (LED) dies to a package substrate, electrically connecting the one or more LED dies and terminals on the package substrate, molding a lens over the package substrate and the one or more LED dies, wherein the lens includes a circumferential trench, and filling the circumferential trench with a phosphor material. A top surface or a portion of the top surface of the molded lens may be coated with a high reflectivity material.

The circumferential trench and the subsequent circumferential phosphor cylinder may have uniform or varying circumference. A portion of the cylinder wall may be thicker than another portion. The walls may be sloped inwards linearly or in a curved manner. The molded lens along with the optional high reflective surface reflect light emitted by the one or more LED dies sideways through the circumferential phosphor cylinder.

These and other features of the present disclosure are discussed below with reference to the associated drawings.

DETAILED DESCRIPTION

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a feature over or on another feature in the description that follows may include embodiments in which the feature and the another feature are formed in direct contact, and may also include embodiments in which additional features may be formed between the feature and the other features, such that the features may not be in direct contact. Of course, the description may specifically state whether the features are directly in contact with each other. In addition, the present disclosure may repeat reference numerals and/or letters in the various examples. This repetition is for the purpose of simplicity and clarity and does not in itself dictate a relationship between the various embodiments and/or configurations discussed.

Generally, an LED package, also referred to herein as an optical emitter, includes an LED die attached to a package substrate, a layer of phosphor material, and some optical components such as lenses and/or reflectors. The LED die is electrically connected to circuitry on the package substrate in a number of ways. One connection method known to the inventors involves attaching the growth substrate portion of the die to the package substrate, and forming electrode pads that are connected to the p-type semiconductor layer and the n-type semiconductor layer in the light-emitting structure on the die, and then bond wiring from the electrode pads to contact pads on the package substrate. Another connection method involves inverting the LED die and using solder bumps to connect the electrode pads on the light-emitting structure directly to the package substrate. This is known as a flip-chip package. Yet another connection method involves using hybrid connectors. One semiconductor layer, for example the p-type layer, may be wired bonded to the package substrate while the other layer (n-type layer) may be soldered or metal bonded to the package substrate after removing the growth substrate.

The LED package may include one or more phosphor materials that are usually applied directly onto the LED die. Conventional methods of applying the one or more phosphor materials include spray-coating the phosphor materials in a concentrated viscous fluid medium, for example, liquid glue, onto the surface of the LED die through which the generated light must pass. As the viscous fluid sets or cures, the phosphor material becomes a part of the LED package. However, dosage and uniformity of a sprayed-on phosphor material is difficult to control. Further, the phosphor material is disposed in close proximity to the LED die and subjected to thermal cycling, which degrades the phosphor material over time reducing light output and changing color output.

Optical components such as reflectors and lenses are used to shape the radiation pattern, or beam pattern. Several optical components are often used to achieve a desired pattern, for example, a batwing beam pattern. A lens may be made of plastic, epoxy, or silicone and is attached to the package substrate by gluing its edge onto the package substrate. Usually, the lens is manufactured separately from the LED die and is available in specific sizes and shapes.

Conventional batwing optical emitters use two lenses to achieve the batwing pattern. A first lens, or primary optics, is a transparent lens attached directly or formed directly on the LED die. The first lens is usually a semi-ellipsoid and functions primarily to extract as much light as possible from the LED die. A second lens, or secondary optics, is fitted and attached over the first lens and serves to shape the beam pattern. Thus, using the methods known to the inventors, a variety of beam patterns may be generated by changing the second lens design without changing other portions of the LED package. Light thus generated by the LED die may travel through a sapphire growth substrate, one or more layers of phosphor material, through a first lens, possibly a gap between the first and the second lens, and finally through the second lens for shaping the batwing pattern. The multiple interfaces can each reduce the light output a small amount, and together, the light output is reduced significantly from that of the LED dies.

The batwing optical emitter known to the inventor using the combination of a primary and secondary optics suffers from several issues with manufacturing, cost, and design. Because the second lens is made separately from the rest of the LED package, it is fitted over the first lens during assembly. Alignment of these optical components affects the resulting beam pattern and thus the tolerance for the alignment is very low. The low tolerance presents manufacturing issues and affects yield. Cost of the batwing optical emitter includes two lenses, which renders the batwing optical emitter more expensive than other optical emitters that generate other beam patterns. As the LED dies becomes more efficient and its dimensions reduce, the separately made second lens and the alignment issue makes dimension reduction of the overall LED package difficult. While smaller second lens can be made, a smaller lens magnifies mis-alignment issues and presents handling difficulties during final assembly. Furthermore, the proximity of the phosphor to the LED dies reduces device reliability and changes color over time.

An optical emitter in accordance with the present disclosure involves only one lens molded directly on one or more LED dies with the phosphor material not directly over the LED dies. Illustrated in FIG. 1 is a flowchart of a method 101 for fabricating an optical emitter in accordance with various embodiments of the present disclosure. FIGS. 2A to 2F are diagrammatic fragmentary cross-sectional side views of the optical emitter during various fabrication stages in accordance with one embodiment of the method 101 in FIG. 1. The optical emitter may be a standalone device or a part of an integrated circuit (IC) chip or system on chip (SoC) that may include various passive and active microelectronic devices such as resistors, capacitors, inductors, diodes, metal-oxide semiconductor field effect transistors (MOSFET), complementary metal-oxide semiconductor (CMOS) transistors, bipolar junction transistors (BJTs), laterally diffused MOS (LDMOS) transistors, high power MOS transistors, or other types of transistors. It is understood that FIGS. 2A to 2F have been simplified for a better understanding of the inventive concepts of the present disclosure. Accordingly, it should be noted that additional processes may be provided before, during, and after the method 101 of FIG. 1, and that some other processes may only be briefly described herein.

Referring to FIG. 1, the method 101 begins with block 103 in which one or more Light-Emitting Diode (LED) dies are attached to a package substrate. FIG. 2 shows a cross-sectional view of a package substrate 201. The package substrate 201 is a silicon substrate, a ceramic substrate, a gallium nitride substrate, a metal core printed circuit board (MCPCB) or other package substrates used for packaging LEDs. The package substrate may include metal pads 203 and through substrate vias 205. Metal pads 203 and through substrate vias (TSVs) 205 are used on packaging substrates in wafer level packaging to conduct electricity and/or heat. Though not necessary for the embodiments described in this disclosure, the use of metal pads and through substrate vias on a silicon substrate improves thermal and electrical conductivities.

Figure 2A:
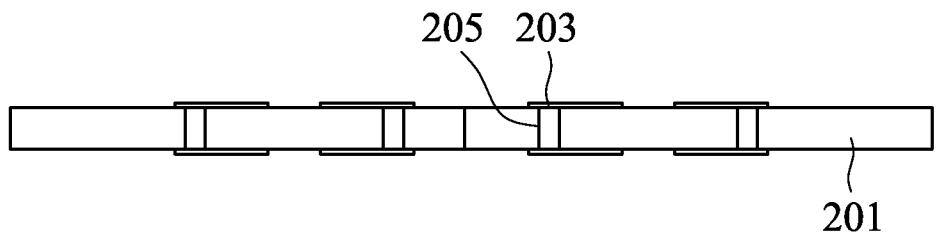
FIGS. 2A to 2F illustrate cross-sectional views of an optical emitter at various stages of fabrication according to various embodiments.
Figure 2B:
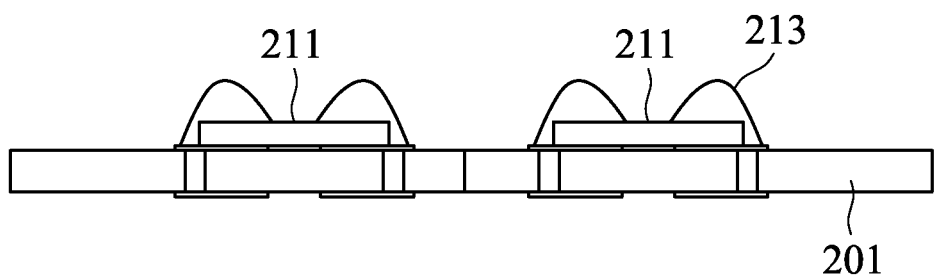

FIG. 2B illustrates the LED dies 211 attached to the package substrate 201. In certain embodiments, where the growth substrate side of the LED die is attached to the package substrate, the attachment may be performed by simply gluing the LED die using any suitable conductive or non-conductive glue, depending on whether the side of the LED die and the package substrate to be attached are conductive and whether isolation is required. In embodiments where the LED die side opposite of the growth substrate is attached to the package substrate, the attachment may include electrically connecting the LED die by bonding the electrode pads on the LED to contact pads on the package substrate. This bonding may involve soldering or other metal bonding. In some embodiments, the growth substrate is removed and one side of the LED die is bonded and electrically connected to the substrate. In this case the attaching may be accomplished using metal bonding such as eutectic bonding.

In one example, the LED dies are attached to the die by soldering. To bond the LED die by soldering, a solder is printed on the package substrate and reflowed while contacting the LED die. In another example, the LED dies are attached by being glued to the substrate using a thermally conductive glue.

An LED die 211 includes a light-emitting structure (not shown) and one or more electrode pads for electrically connecting to a package substrate, the details of which are not shown in FIG. 2B. While the following disclosure refers to an optical emitter with a blue LED, the concepts describes herein could apply to other color LEDs as long as a phosphor is used to convert at least a portion of the light emitted from the LED to a different wavelength. The light-emitting structure has two doped layers and a multiple quantum well layer between the doped layers. The doped layers are oppositely doped semiconductor layers. In some embodiments, a first doped layer includes an n-type gallium nitride material, and the second doped layer includes a p-type material. In other embodiments, the first doped layer includes a p-type gallium nitride material, and the second doped layer includes an n-type gallium nitride material. The MQW layer includes alternating (or periodic) layers of active material, for example, gallium nitride and indium gallium nitride. For example, in one embodiment, the MQW layer includes ten layers of gallium nitride and ten layers of indium gallium nitride, where an indium gallium nitride layer is formed on a gallium nitride layer, and another gallium nitride layer is formed on the indium gallium nitride layer, and so on and so forth.

The doped layers and the MQW layer are all formed by epitaxial growth processes. After the completion of the epitaxial growth process, a p-n junction (or a p-n diode) is essentially formed. When an electrical voltage is applied between the doped layers, an electrical current flows through the light-emitting structure, and the MQW layer emits light. The color of the light emitted by the MQW layer associated with the wavelength of the emitted radiation, which may be tuned by varying the composition and structure of the materials that make up the MQW layer. The light-emitting structure may optionally include additional layers such as a buffer layer between the substrate and the first doped layer, a reflective layer, and an ohmic contact layer. A suitable buffer layer may be made of an undoped material of the first doped layer or other similar material. A light-reflecting layer may be a metal, such as aluminum, copper, titanium, silver, alloys of these, or combinations thereof. An ohmic contact layer may be an indium tin oxide (ITO) layer, a titanium nitride layer, or a thin layer of other conductive material that is substantially transparent to the light emitted by the LED. The light reflecting layer and ohmic contact layer may be formed by a physical vapor deposition (PVD) process, a chemical vapor deposition (CVD), or other deposition processes.

After the LED die is attached to the substrate, the LED die is electrically connected to the package substrate in operation 105 of FIG. 1. At least two electrical connections are made, one each to the p-type and n-type doped layers. In some cases, two electrical connections are made to the p-type layer for current spreading purposes. As discussed, the electrical connection may involve wire bonding, soldering, metal bonding, or a combination of these. FIG. 2B further illustrates wire bonds 213 between the LED dies 211 and metal pads 203. The wire bonds 213 connect electrodes on the LEDs the metal pads 203, which is electrically connected to terminals on the back side of the package substrate 201 through the TSVs 205. Although the FIG. 2B illustrate a horizontal package, the LED dies may be attached to the package substrate in a number of ways, including vertical packaging using only one wire bond or flip chip packaging using no wires. Because the electrical connection 213 may take a variety of forms, the structure shown in FIG. 2B is illustrative only--the electrical connections 213 need not be a wire bond.

Referring back to FIG. 1, at operation 107 a lens is molded over the LED dies and the package substrate. The lens includes a circumferential trench. The lens may be formed by injection molding or compression molding. A variety of materials may be used as the lens. Suitable materials have a high optical permissivity (transparency), a viscosity suitable for molding, appropriate adhesion to the package substrate, and good thermal conductivity and stability (i.e., do not degrade or change color during thermal cycling). Example materials include silicone, epoxy, certain polymers, resins and plastics including Poly(methyl methacrylate) (PMMA). Suitable materials are flowable for molding into the lens and can be cured into a defined shape. Some suitable materials may have thermal expansion coefficients that are similar to that of the package substrate and/or can absorb stress caused by a difference in the thermal expansion during thermal cycling. Examples of suitable lens materials include Shin-Etsu's line of SCR and KER silicone resins and rubber materials and Dow Comings' various lines of silicon gels, elastomers, and silicone resins. As understood, a manufacturer in the industry can adjust the refractive index of the lens material as a customer specifies. Thus, one skilled in the art can select a suitable lens material based on suitable material properties other than the refractive index first, then specify the refractive index within a range that can be supplied by the manufacturer.

Figure 2C:
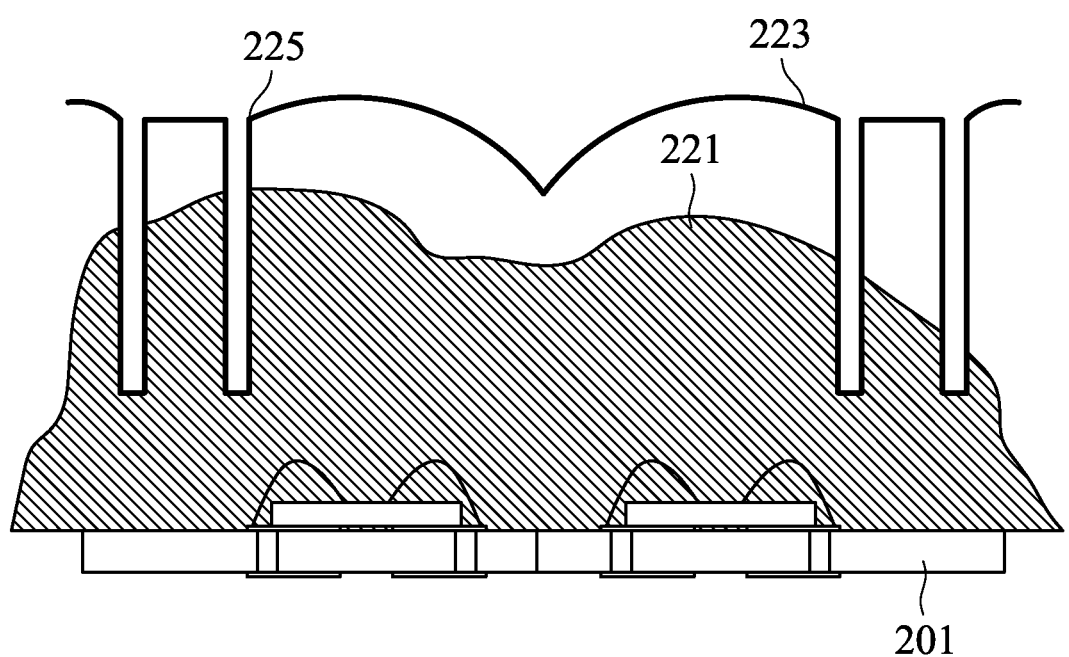

In certain embodiments, a compression molding method is used as shown in FIG. 2C. A lens precursor material 221 is dispensed over the LED dies and the package substrate and then a lens mold 223 is placed over lens precursor material 221. The lens mold 223 includes circumferential trench 225 and may include one or more openings for excess lens material and air to escape the mold 223 as the mold 223 is compressed against the package substrate. The position and number of openings on the lens mold 223 depends on the process conditions and the material properties involved. A number of openings may be used and the openings may be located at different places. While FIG. 2C illustrate one lens cavity placed over two LED dies, the lens mold may include multiple mold cavities that would fit over a package substrate having many LED dies attached thereon to form lenses for a number of packages at the same time. The package substrate 201 may include alignment marks between individual LED dies to ensure that the lens cavities are placed accurately over the LED dies.

To ensure a good fill, the gas inside the lens cavity may be evacuated through one or more openings. Alternatively, this operation is performed in a vacuum environment, in which the instant openings may be not required. The lens precursor material/glue 221 may be heated or under pressure. The lens precursor material 221 fills the lens cavity to form the lens when the mold 223 is pressed against the package substrate.

The lens precursor material is cured to set so that it retains its shape and adheres to the package substrate and LED die as shown. Radiation or other energy may be applied to the lens mold, which allows the radiation the pass through. The radiation may be an ultraviolet (UV) radiation, thermal radiation (infrared), microwave, or another radiation that can cure the lens glue. Glue materials that cure under UV light or under heat application are commercially available. In some instances, curing may be accomplished by only thermal energy, which need not be applied in the form of radiation.

Conductive heat energy may be applied through the package substrate 201 or through heating of the lens mold 223.

Figure 2D:
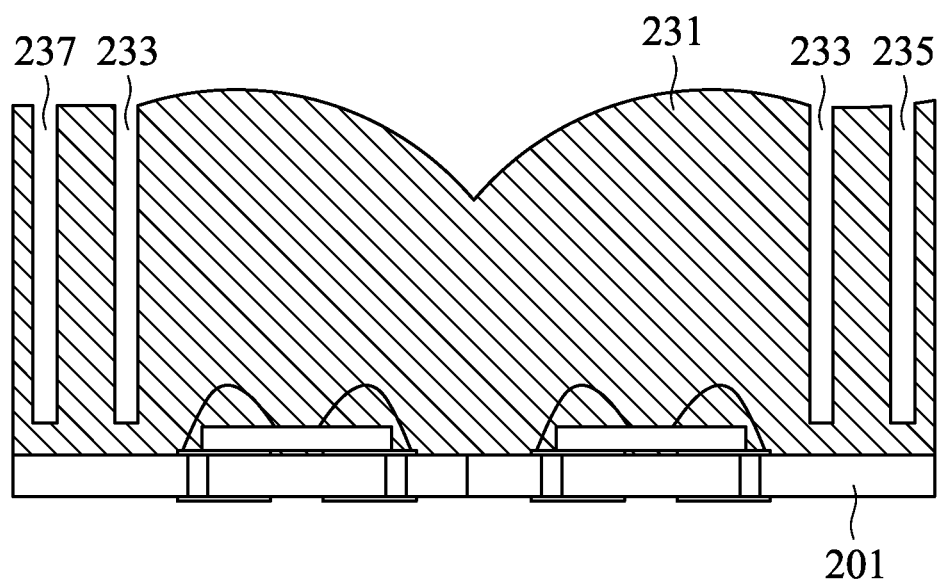

After the lens has cured, the lens mold may be removed, as shown in FIG. 2D. The lens mold 223 is removed so as not to remove the lens 231 from the package substrate 201. In one embodiment, some gas can be added via one or all of the mold openings to help separate the lens 231 from the lens mold 223. Other techniques include changing the temperature of either the molded lens or the lens mold such that a temperature difference exists or using a removal template in the lens mold 223. In another embodiment, the circumferential trenches are made to have different trench widths. The trench may be narrower at the bottom and wider at the top so that the lens mold is easier to remove.

The circumferential trench 233 is thus formed in the lens 231. Note that FIG. 2D shows neighboring circumferential trenches 235 and 237 formed by the same mold. These neighboring circumferential trenches 235 and 237 belong to neighboring optical emitters. Eventually, the package substrate will be diced into individual optical emitters at the location between the circumferential trenches, for example, between trenches 233 and 237, through the lens material to form individual optical emitters.

Figure 2E:
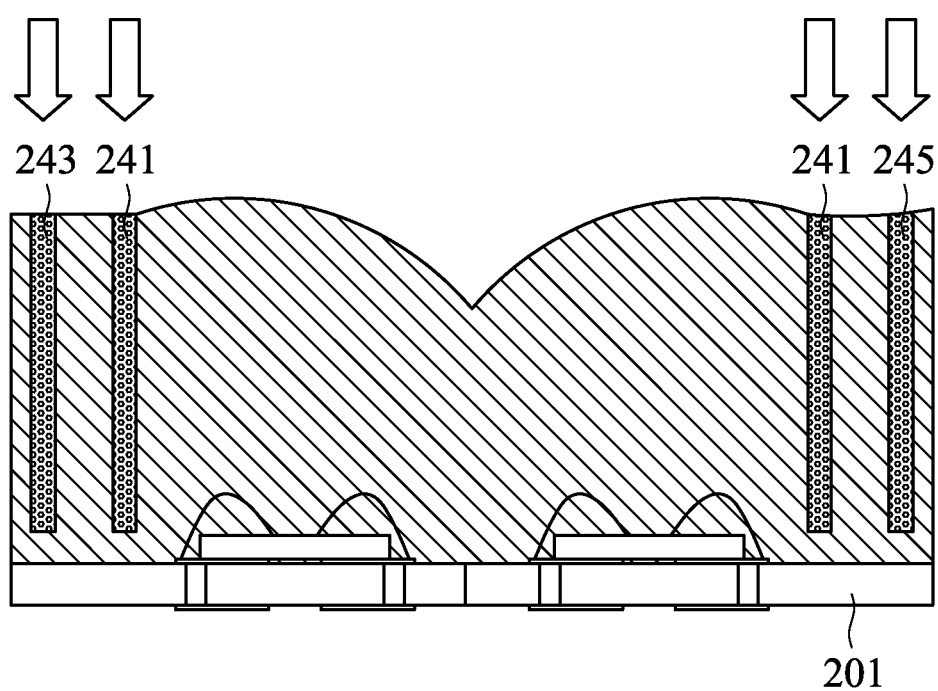

Referring back to FIG. 1, in operation 109 the circumferential trenches are filled with a phosphor material. The phosphor material may be filled by dispensing or injecting the phosphor material into the circumferential trenches, as shown in FIG. 2E. The dispensing may be accomplished by printing a viscous liquid containing the phosphor over the lens material, and flowing the liquid into the trenches by vibration, either via physical movement of the package substrate or sonic/ultrasonic waves. The dispensing may also be accomplished by submerging the entire partially fabricated package into a liquid medium containing the phosphor material. The injecting may be accomplished by tracing the trench with an injection gun or pen. An entire circumferential trench may be injected by using injection guns with output ports having the same shape as the circumferential trench. Further, the circumferential trenches may be filled by a spin coating process where excess material is spun off the surface of the lens. One skilled in the art would be able to select the right material with phosphor to form the phosphor material so that the trenches can be properly filled based on the filling technique to be used.

After the phosphor material is applied to the circumferential trench, it is solidified into a circumferential cylinder, shown as 241 in FIG. 2E. Phosphor may be mixed with silicone, epoxy, polymers, resins, silicone resin and plastics including Poly(methyl methacrylate) (PMMA). The material is preferably selected to have similar thermal expansion coefficients as the lens so as to minimize thermal cycling induced stress between the two materials. Of course, the same base material may be used--the only difference being the addition of phosphor. Depending on the material properties of the mixture, the phosphor material may be solidified by curing with radiation or heat and by setting and allowing chemical reactions to form a matrix. The phosphor cylinder is then embedded in the lens.

If the circumferential trench has varying widths, then the circumferential cylinder formed also has varying thicknesses. This wall of phosphor serves to change the wavelength of LED emitted light and reflected light so that a light of different color from what was emitted is perceived outside of the optical emitter. The thickness variance may depend on the expected light at different locations of the cylinder to create a uniform color distribution. For example, where more reflected light is expected, the cylinder wall may be thicker so the light converted by the phosphor remains the same ratio regardless of the angle of perception. This phosphor cylinder 241 may also be used in conjunction with another phosphor layer, for example, another phosphor cylinder concentric to the first one (243 and 245) or a phosphor layer applied directly to the LED dies to create a variety of colors, for example, white light. To create white light, when only one phosphor cylinder is used, the phosphor may be a phosphor that generates yellow light when excited by a blue light. When two phosphor layers are used, one phosphor layer may be a green phosphor and another may be a red phosphor. In other embodiments, phosphor cylinders 243 and 245 are separate cylinders belonging to different optical emitters.

In some embodiments, the curing for the phosphor cylinder and the lens may occur sequentially or together. The lens may be formed and set with a soft cure so as to retain its shape. Then the phosphor material may be added to the circumferential trench. The two materials may be cured together in a "hard bake" to finalize the solidification process.

In other embodiments, the lens may be formed and cured completely before the phosphor material is added. The phosphor cylinder may be designed to be softer than the lens material. Then during the thermal cycling the phosphor cylinder may absorb some of the thermal expansion stresses which reduces the chance that the thermal cycling stresses delaminates the lens from the package substrate.

Figure 2F:
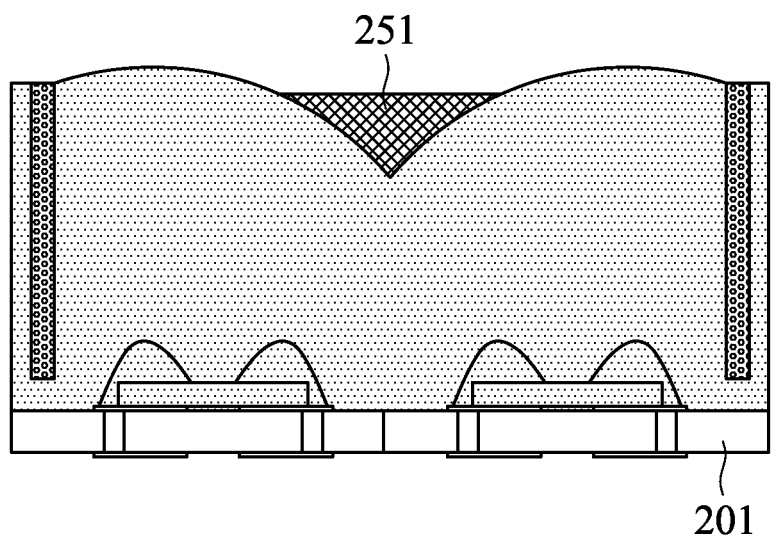

Referring back to FIG. 1, after the lens and the phosphor cylinder are formed, a top surface of the lens may be optionally coated with a reflective material in operation 111. As noted above, the required reflectivity of the surface coating material depends on the batwing beam pattern requirements and a variety of coating material may be used. The surface coating material may be dispensed, sprayed, spun, or otherwise deposited on the lens top surface. An example would be to use a gel containing reflective additives, for example, a silicon gel, dispensed onto the top surface of the lens. Additives may include metal particles such as silver or other metals, some metal oxide such as titanium oxide, zinc oxide, and zirconium oxide. Other highly reflective additives may be used. Examples of other highly reflective coatings include dielectric films tuned to reflect the specific wavelengths of light emitted by the LED die. In some embodiments, the surface coating selected reflects more than 80% of the incident light, about 90% of the incident light, or more than 90% of the incident light. In some instances the surface coating merely coats a portion of top surface. In other instances the surface coating may coat the entire top surface. FIG. 2F illustrate a reflector 251 coating on a portion of the lens.

In other embodiments, the reflective coating is not used. The lens may be shaped such that light reaching the top surface from the LED die is mostly reflected off the surface as total internal reflection (TIR). TIR is an optical phenomenon that occurs when a ray of light strikes a boundary between two medium at an angle larger than a particular critical angle with respect to the normal to the surface. At this larger angle, if the refractive index is lower on the other side of the boundary, no light can pass through and all of the light is reflected. The critical angle is the angle of incidence above which the total internal reflection occurs. If the angle of incidence is greater (i.e., the ray is closer to being parallel to the boundary) than the critical angle—the angle of incidence at which light is refracted such that it travels along the boundary—then the light will stop crossing the boundary altogether and instead be totally reflected back internally. The top lens surface in accordance with various embodiments of the present disclosure has a surface that renders most of the angle of incidence greater than the critical angle. Because the refractive index on the other side of the top surface is lower (for example, air has a refractive index of about 1) than that of the lens (for example, silicon molding has refractive indices of about 1.4 to 1.55), most of the light from the LED may be reflected as TIR. A combination of surface coating and lens shape design may be used to ensure that most of the light emitted by the LED dies is reflected from the top surface.

Referring back to FIG. 1, the package substrate may be diced into a number of optical emitters in operation 113. As shown in FIG. 2F, the optical emitter is separated from its neighbors outside of the phosphor cylinder. The package substrate may be diced using mechanical means such as sawing or cutting. The package substrate may also be diced using radiation energy, such as laser. The use of laser allows a non-linear cut to be used. For example, the optical emitters may have a round base instead of a rectangular base.

Figure 3A:
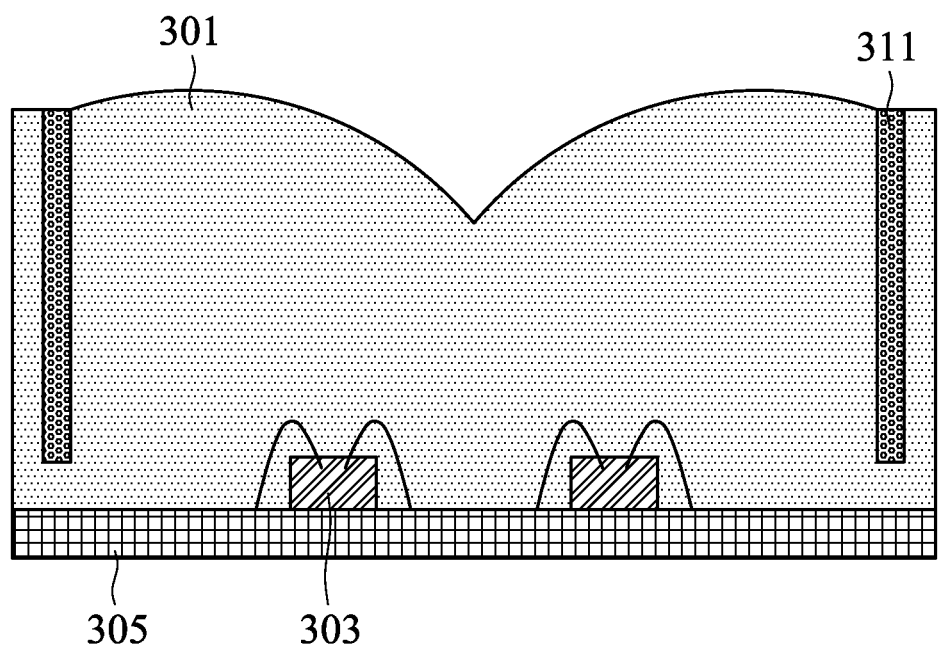
FIGS. 3A to 3C illustrate cross section view and top view examples of various embodiments of the present disclosure.
Figure 3B:
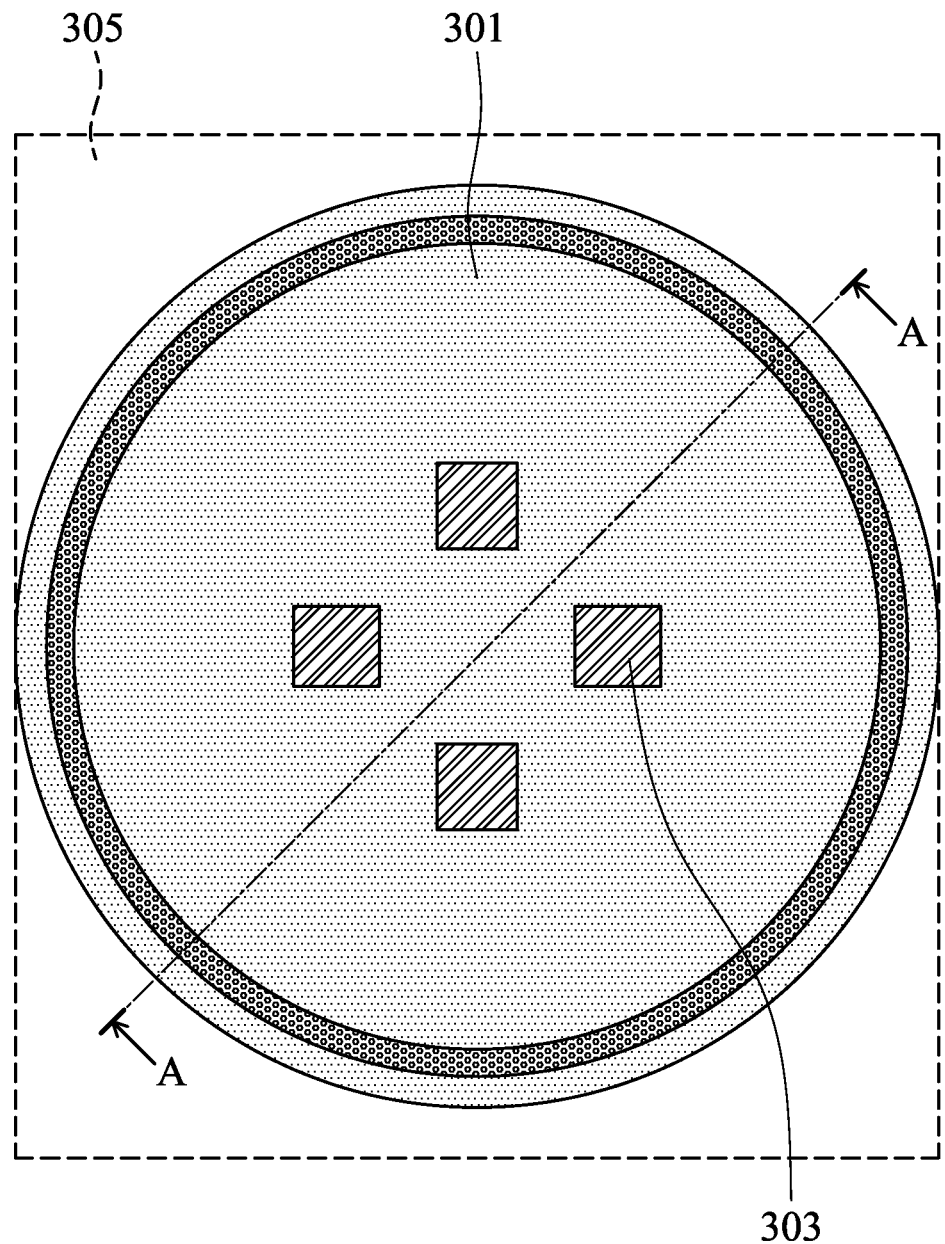
Figure 3C:
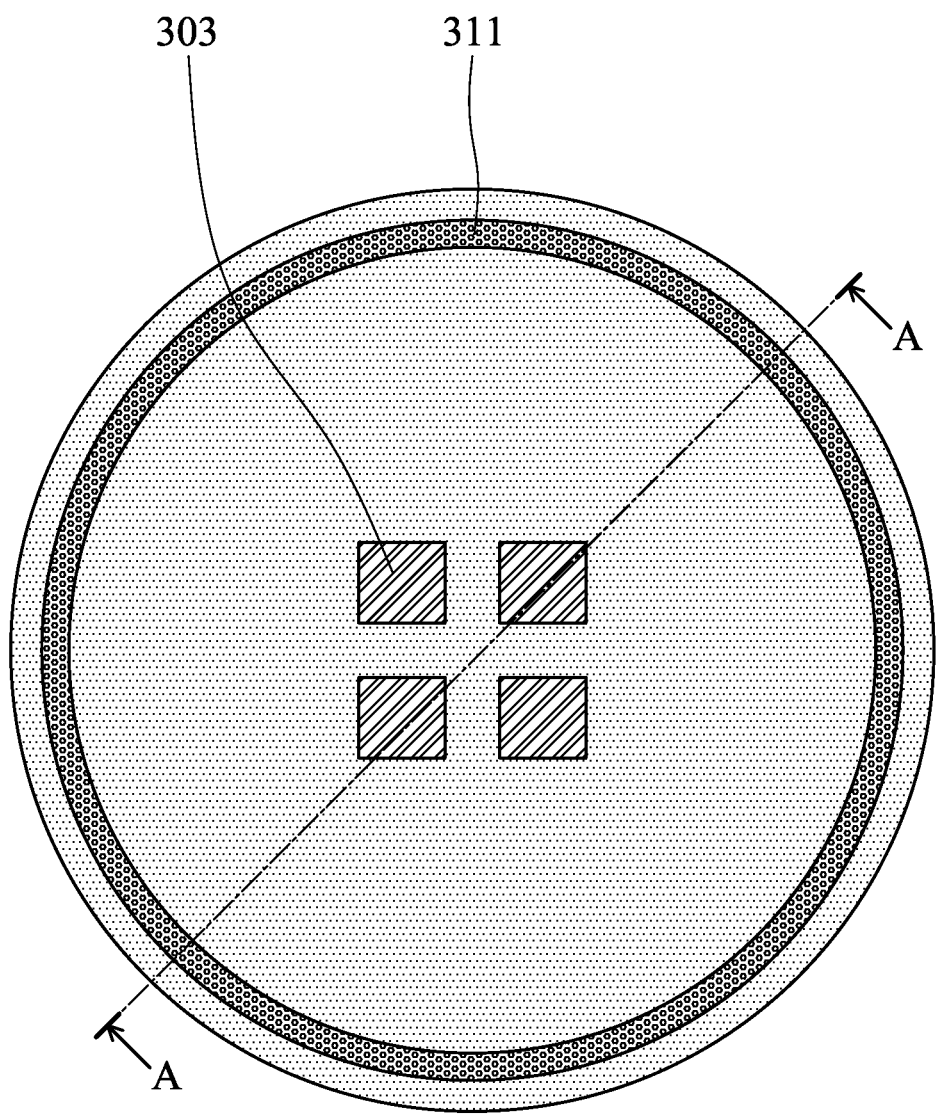

The optical emitter according to various embodiments of the present disclosure applies to having only one LED die as well as several LED dies. The LED dies may be arranged in a linear array, in a rectangular array, or in a circle or other shapes. FIGS. 3A to 3C illustrate a number of embodiments. FIG. 3A is a cross section view of FIG. 3B or 3C, at a 45 degree angle through a center of the optical emitter. The embodiments of FIGS. 3A to 3C include no reflective coating on the top surface of the lens 301. In these embodiments, four LED dies 303 are mounted on the substrate 305. In FIG. 3B, each die has a side closest to the center of the optical emitter. In FIG. 3C, each die has a corner closest to the center of the optical emitter. The placement of the dies depends on the profile of the lens to cause TIR. Note that the package substrate for the optical emitter may be a rectangle or square as shown in FIG. 3B; or round or oval as shown in FIG. 3C. The phosphor circumferential cylinder 311 may also be round or oval depending on the shape and placement of the LED dies and the lens shape. In a top view, the lens has a circular or oval shape. The shape may be achieved by the mold when the lens is formed. The shape may also be formed by subsequent cutting or etching.

Figure 4A:
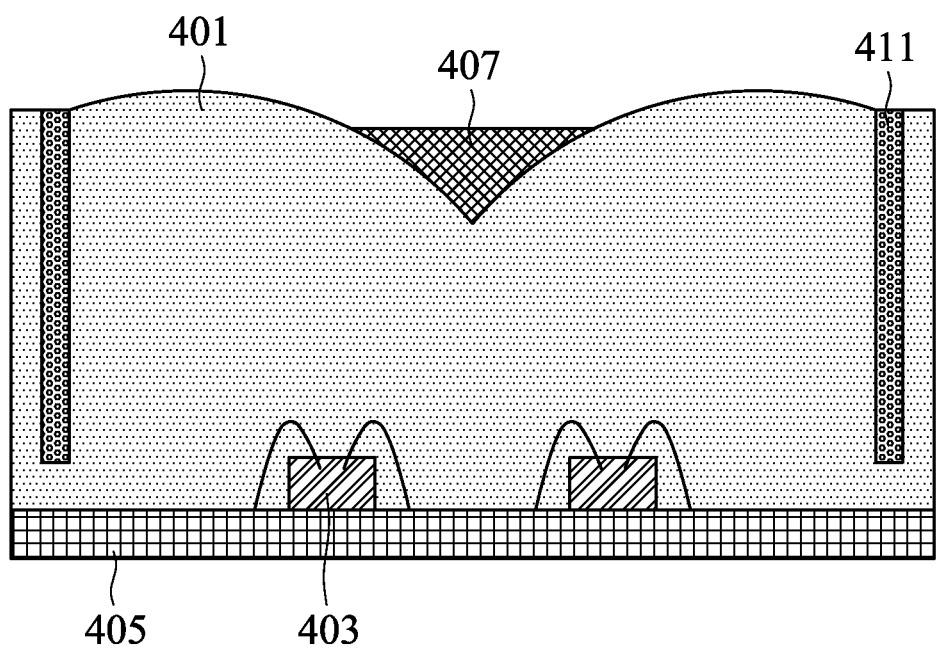
FIGS. 4A to 4C illustrate cross section view and top view examples of various embodiments of the present disclosure.
Figure 4B:
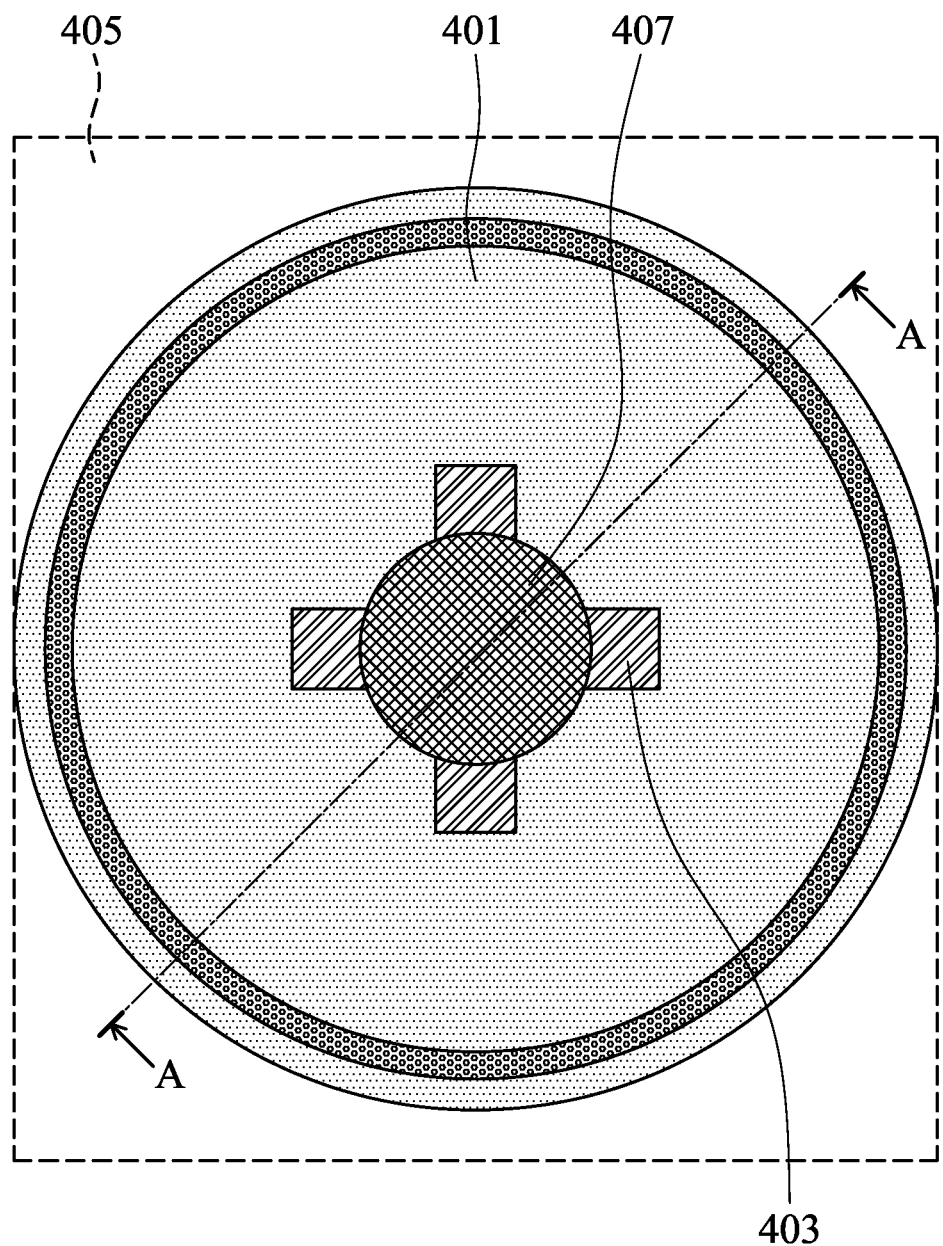
Figure 4C:
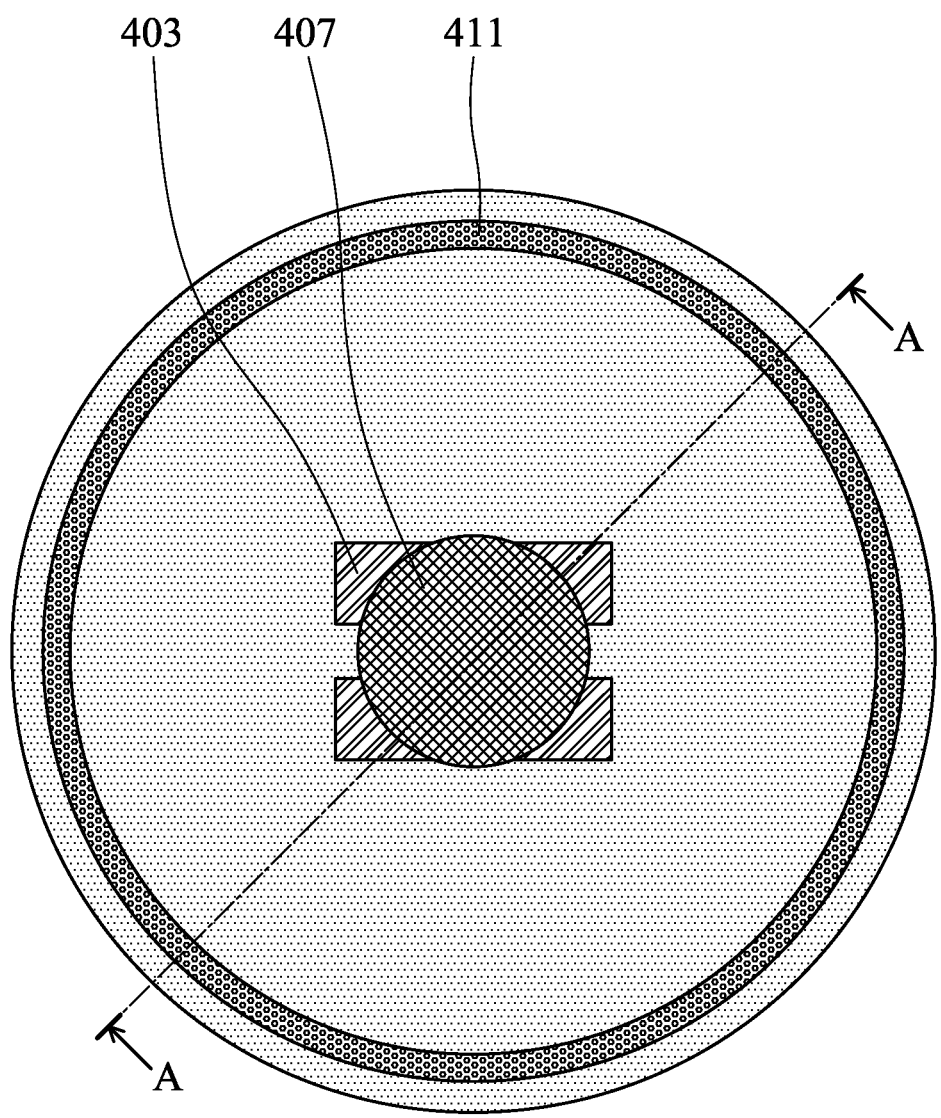

FIGS. 4A to 4C illustrate a number of other embodiments. FIG. 4A is a cross section view of FIG. 4B or 4C, at a 45 degree angle through a center of the optical emitter. The embodiments of FIGS. 4A to 4C includes reflective coating on a portion of the top surface of the lens 401. The portion may be a center portion. The coating may partially fill a cavity as shown in FIG. 4A, or may be applied as a thin layer. In these embodiments, four LED dies 403 are mounted on the substrate 405. In FIG. 4B, each die has a side closest to the center of the optical emitter. In FIG. 4C, each die has a corner closest to the center of the optical emitter. The reflective coating, the shape of the lens, and placement of the dies together cause TIR off the top surface of the lens. Note that the package substrate for the optical emitter may be a rectangle or square as shown in FIG. 4B; or round or oval as shown in FIG. 4C.

Figure 5A:
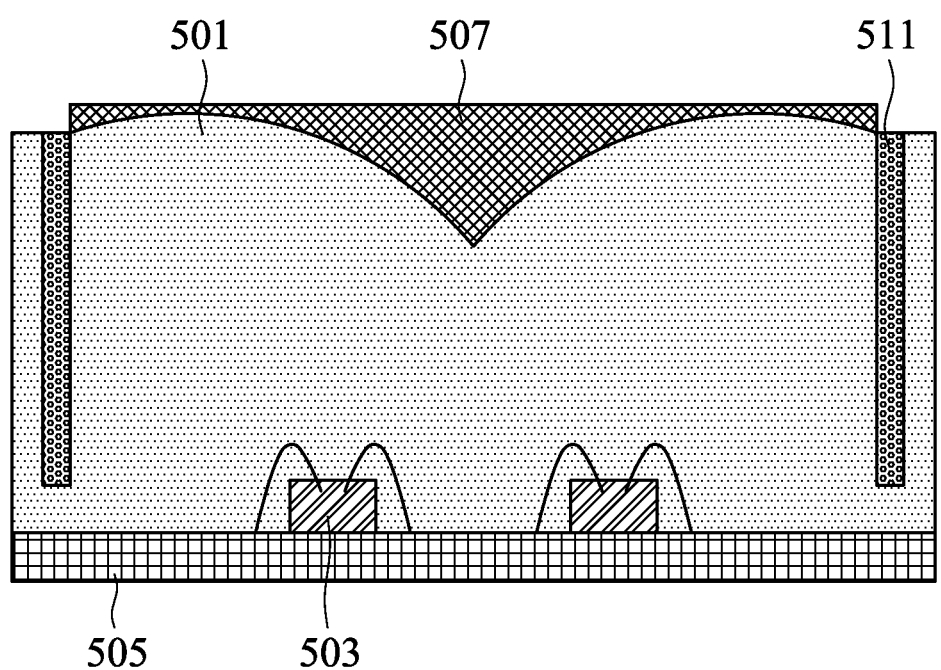
FIGS. 5A to 5C illustrate cross section view and top view examples of various embodiments of the present disclosure.
Figure 5B:
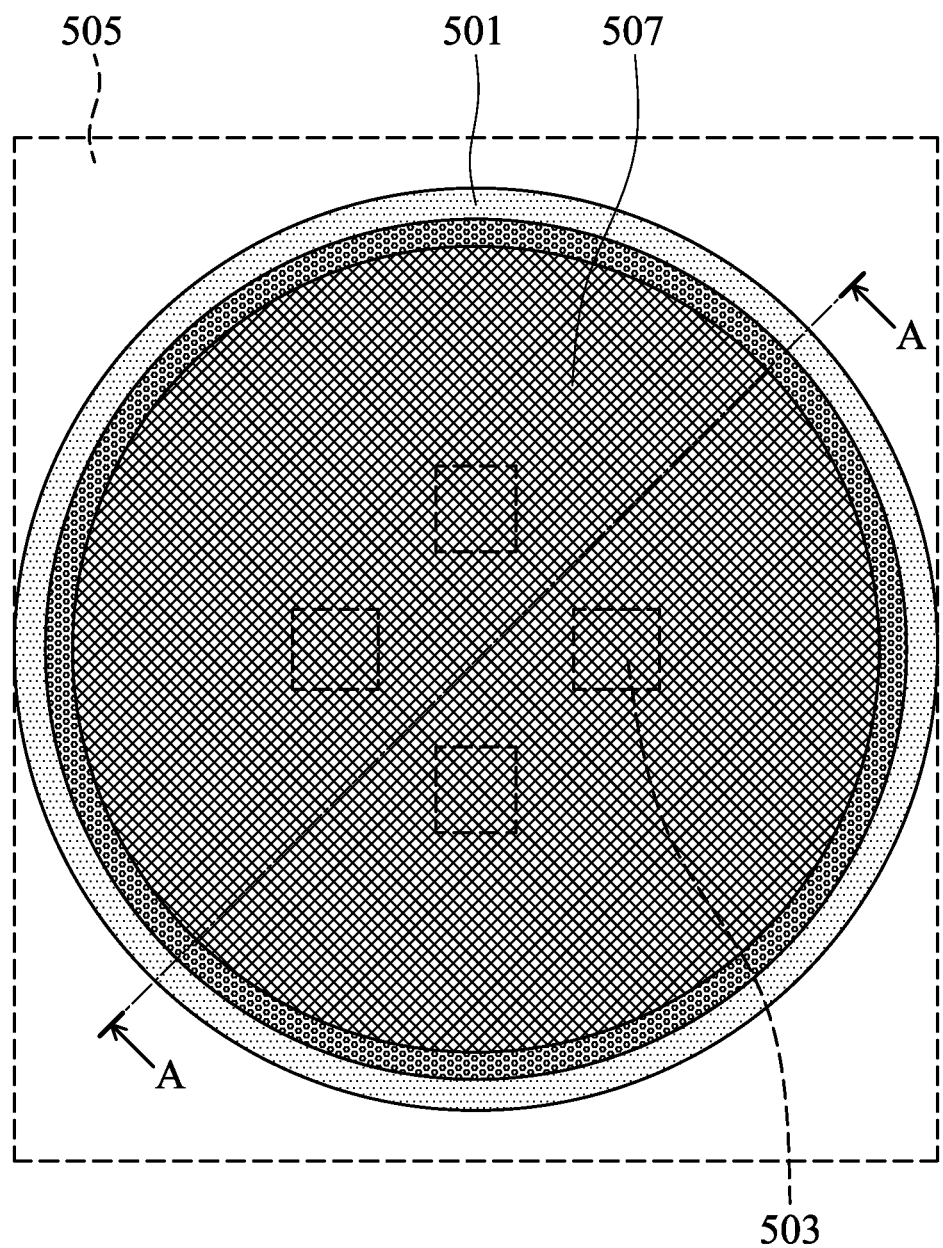
Figure 5C:
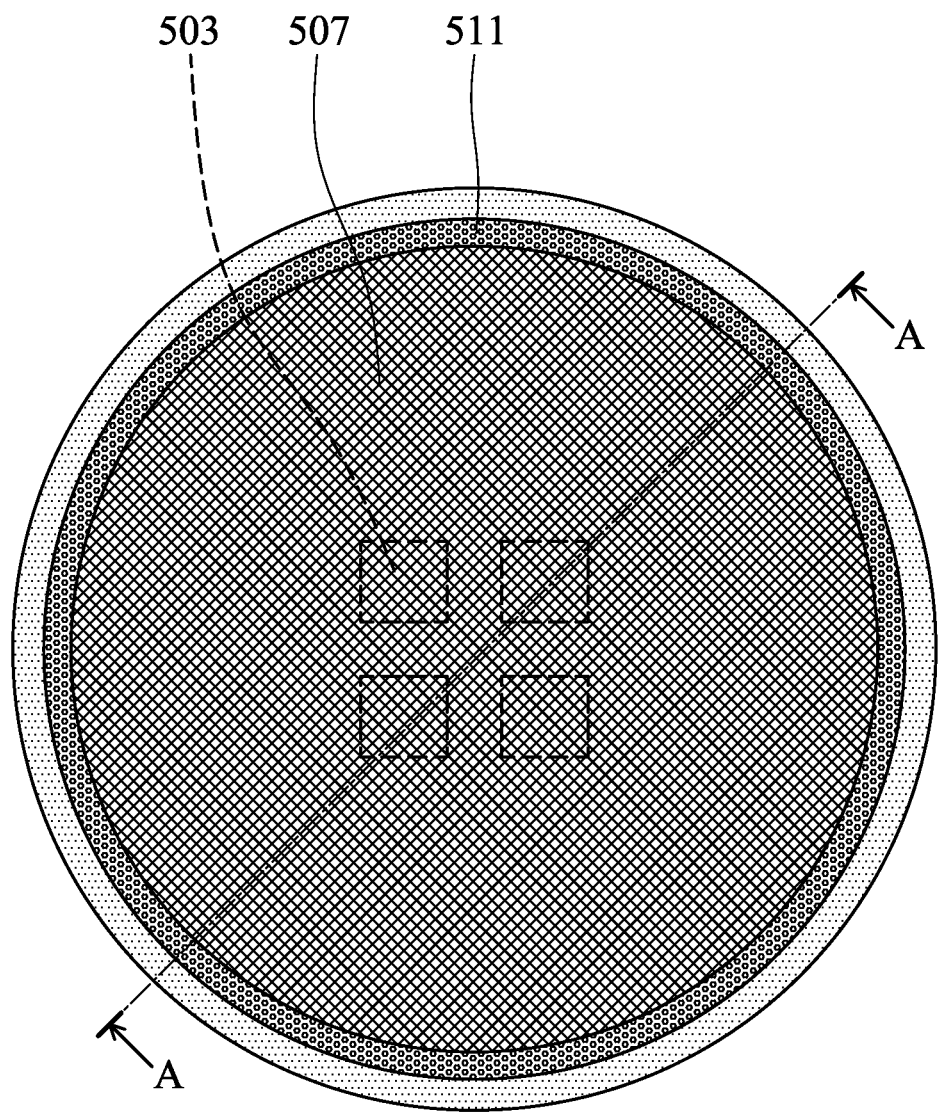

FIGS. 5A to 5C illustrate yet a number of other embodiments. FIG. 5A is a cross section view of FIG. 5B or 5C, at a 45 degree angle through a center of the optical emitter. The embodiments of FIGS. 5A to 5C include reflective coating on a portion of the top surface of the lens 501. The portion may be a center portion. The coating may fill a cavity as shown in FIG. 5A, or may be applied as a thin layer over the entire top surface of the lens. In these embodiments, four LED dies 503 are mounted on the substrate 505. In FIG. 5B, each die has a side closest to the center of the optical emitter. In FIG. 5C, each die has a corner closest to the center of the optical emitter. The reflective coating causes TIR off the top surface of all of the lights generated by the LED dies to exit the optical emitter from the sides. Note that the package substrate for the optical emitter may be a rectangle or square as shown in FIG. 5B; or round or oval as shown in FIG. 5C.

In other embodiments of the present disclosure, a different number of LED dies are used. For example, three LED dies may be arranged to form vertices of an equilateral triangle. In another embodiment, five LED dies are arranged to form two rows--one row of two LED dies and one row of three LED dies. In each of these multiple LED die configurations, one lens is formed over the LED dies.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. It is understood, however, that these advantages are not meant to be limiting, and that other embodiments may offer other advantages. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A lighting apparatus, comprising:
   a substrate;
   one or more light-emitting devices disposed over the substrate;
   a lens that is molded over the substrate and over the one or more light-emitting devices; and
   a recess disposed in the lens, wherein the recess circumferentially surrounds the one or more light-emitting devices in a top view, and wherein the recess is at least partially filled with phosphor particles.

2. The lighting apparatus of claim 1, wherein the recess has a circular shape in a top view.

3. The lighting apparatus of claim 1, wherein the recess has an elongate cross-sectional view and extends at least partially into the lens from a top surface of the lens.

4. The lighting apparatus of claim 1, wherein the lens is configured to transmit light emitted by the one or more light-emitting devices in a batwing pattern.

5. The lighting apparatus of claim 1, further comprising a reflective material disposed over at least a portion of a top surface of the lens.

6. The lighting apparatus of claim 5, wherein the reflective material contains metal or metal oxide.

7. The lighting apparatus of claim 5, wherein the portion of the top surface of the lens has a concaved cross-sectional profile.

8. The lighting apparatus of claim 5, wherein the reflective material is disposed over an entirety of the top surface of the lens.

9. The lighting apparatus of claim 1, wherein the lens contains silicone, resin, epoxy, or a poly(methyl methacrylate) (PMMA).

10. The lighting apparatus of claim 1, wherein the substrate is a packaging substrate that contains one or more through substrate vias (TSVs).

11. The lighting apparatus of claim 1, wherein the light-emitting devices include light-emitting diodes (LEDs).

12. A lighting apparatus, comprising:
    a packaging substrate;
    one or more light-emitting diodes (LEDs) located over the packaging substrate;

a molded lens disposed over the packaging substrate and housing the one or more LEDs therein;

a phosphor-containing trench that extends into the molded lens from an upper surface of the molded lens, wherein the phosphor-containing trench circumferentially surrounds the one or more LEDs in a top view; and a reflector disposed over at least a portion of the upper surface of the molded lens.

13. The lighting apparatus of claim 12, wherein the trench has a round top view pattern.

14. The lighting apparatus of claim 12, wherein the molded lens is configured to transmit light emitted by the LEDs in a batwing pattern.

15. The lighting apparatus of claim 12, wherein the upper surface of the molded lens includes a cavity, and wherein at least a portion of the reflector is disposed within the cavity.

16. The lighting apparatus of claim 12, wherein the reflector is disposed over an entirety of the upper surface of the molded lens.

17. The lighting apparatus of claim 12, wherein:
the molded lens contains silicone, resin, epoxy, or a poly (methyl methacrylate) (PMMA); and
the reflective material contains metal or metal oxide.

18. A lighting apparatus, comprising:
a packaging substrate;
one or more light-emitting diode (LED) dies bonded to the packaging substrate;
a molded lens formed over the packaging substrate and covering the one or more LED dies underneath, wherein a top surface of the molded lens includes a cavity;
one or more phosphor-containing trenches embedded in the molded lens, wherein the phosphor-containing trenches each circumferentially surround the one or more LED dies in a top view, and wherein at least one of the phosphor-containing trenches has a circular top view profile; and
a light-reflective element formed over at least a portion of the top surface of the molded lens, wherein at least a portion of the light-reflective element is formed in the cavity.

19. The lighting apparatus of claim 18, wherein the molded lens is configured to transmit light emitted by the LED dies in a batwing pattern.

20. The lighting apparatus of claim 12, wherein the light-reflective element is formed over an entirety of the top surface of the molded lens.

* * * * *